United States Patent
Lee (10) Patent No.: US 10,991,424 B2
(45) Date of Patent: Apr. 27, 2021

(54) ELECTRONIC DEVICE, MEMORY DEVICE, AND METHOD OF OPERATING MEMORY DEVICE

(71) Applicant: SK hynix Inc., Icheon (KR)

(72) Inventor: Seung Yun Lee, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/594,866

(22) Filed: Oct. 7, 2019

(65) Prior Publication Data

US 2020/0357464 A1 Nov. 12, 2020

(30) Foreign Application Priority Data

May 8, 2019 (KR) .................. 10-2019-0053877

(51) Int. Cl.
*G11C 13/00* (2006.01)

(52) U.S. Cl.
CPC ........ *G11C 13/0004* (2013.01); *G11C 13/004* (2013.01); *G11C 13/0069* (2013.01); *G11C 2013/0052* (2013.01); *G11C 2013/0092* (2013.01)

(58) Field of Classification Search
CPC ............ G11C 13/0004; G11C 13/0069; G11C 13/004; G11C 2013/0052; G11C 2013/0092

See application file for complete search history.

(56) References Cited

U.S. PATENT DOCUMENTS

| 7,443,721 | B2 * | 10/2008 | Kurotsuchi ........ | G11C 13/0061 365/163 |
| 7,859,896 | B2 * | 12/2010 | Kurotsuchi ............. | H01L 27/24 365/163 |
| 9,711,216 | B2 * | 7/2017 | Hase ................... | G11C 13/0097 |
| 9,799,381 | B1 * | 10/2017 | Tortorelli ........... | G11C 13/0069 |
| 2016/0267975 | A1 * | 9/2016 | Takeuchi ........... | G11C 13/0007 |
| 2017/0125097 | A1 | 5/2017 | Tortorelli et al. | |
| 2018/0122468 | A1 * | 5/2018 | Pirovano .............. | G11C 13/004 |

(Continued)

OTHER PUBLICATIONS

D. Ielmini et al., "Effects of threshold switching and parasitic capacitance in the programming transient of chalcogenide phase-change memories", ICMTD, 2005, 4 pages.

(Continued)

*Primary Examiner* — Tri M Hoang (57) ABSTRACT

The present technology provides an electronic device, a memory device, and a method of operating a memory device. The memory device includes a memory cell array including a variable resistance memory cell coupled to a first conductive line and a second conductive line, and a peripheral circuit configured to provide a write pulse or a read pulse to the variable resistance memory cell through the first conductive line. The write pulse is controlled to have one of a first polarity and a second polarity that are opposite to each other. The read pulse is controlled to have a polarity corresponding to a greater value of first and second amorphization start current values of the variable resistance memory cell, the first amorphization start current value being determined by a first pulse having the first polarity, the second amorphization start current value being determined by a second pulse having the second polarity.

20 Claims, 9 Drawing Sheets

(56) References Cited

U.S. PATENT DOCUMENTS

2018/0122472 A1    5/2018  Pirovano et al.
2019/0206489 A1*   7/2019  Wang ................ G11C 13/0069

OTHER PUBLICATIONS

D. Tio Castro et al., "Evidence of the Thermo-Electric Thomson Effect and Influence on the Program Conditions and Cell Optimization in Phase-Change Memory Cells", IEEE, 2007, 4 pages.
Derchang Kau et al., "A stackable cross point phase change memory", IEEE, 2009, 4 pages.
Agostino Pirovano et al., "Reliability Study of Phase-Change Nonvolatile Memories", IEEE Transactions on Device and Materials Reliability, vol. 4, No. 3, 2004, 4 pages.

* cited by examiner

FIG. 11 though the disclosure states otherwise. The first amorphization start current value may be determined by applying a first pulse having the first polarity to a variable resistance memory cell, and the second amorphization start current value may be determined applying a second pulse having the second polarity to the variable resistance memory cell, the second polarity being opposite to the first polarity.

ELECTRONIC DEVICE, MEMORY DEVICE, AND METHOD OF OPERATING MEMORY DEVICE

CROSS-REFERENCE TO RELATED APPLICATION

The present application claims priority under 35 U.S.C. § 119(a) to Korean patent application number 10-2019-0053877 filed on May 8, 2019, the entire disclosure of which is incorporated herein by reference in its entirety.

BACKGROUND

Field of Invention

The present disclosure relates to an electronic device, a variable resistance memory device, and a method of operating the variable resistance memory device.

Description of Related Art

An electronic device such as a computer, a digital camera, and a smart phone uses a memory system to process data. The memory system may include a memory device in which data is stored and a controller that controls the memory device.

A memory device is being developed variously in accordance with the trends of high performance, miniaturization, and low power consumption. A variable resistance memory device has been proposed as an example of a next generation memory device. The variable resistance memory device may have one of different resistance states depending on a voltage or a current applied to a memory cell, and may maintain a resistance state stored in the memory cell in the absence of a power supply. As such a variable resistance memory device, there are a phase change random access memory (PRAM), a magnetic RAM (MRAM), a resistive RAM (RRAM), a ferroelectric RAM (FRAM), an e-fuse, and so on.

SUMMARY

An electronic device according to an embodiment of the present disclosure may include a memory device and a memory controller configured to control the memory device. The memory device may include a memory cell array including a variable resistance memory cell coupled to and disposed between a first conductive line and a second conductive line that intersect with each other. The memory device may further include a peripheral circuit configured to provide a write pulse or a read pulse to the variable resistance memory cell through the first conductive line. The peripheral circuit may control the write pulse to have one of a first polarity and a second polarity that are opposite to each other, and control the read pulse to have a polarity corresponding to a greater value of first and second amorphization start current values of the variable resistance memory cell, the first amorphization start current value being determined by a first pulse having the first polarity, the second amorphization start current value being determined by a second pulse having the second polarity.

A memory device according to an embodiment of the present disclosure may include a memory cell array including a variable resistance memory cell coupled to and disposed between a first conductive line and a second conductive line that intersect with each other. The memory device may further include a peripheral circuit configured to provide a write pulse or a read pulse to the variable resistance memory cell through the first conductive line. The write pulse may be controlled to have one of a first polarity and a second polarity that are opposite to each other. The read pulse may be controlled to have a polarity corresponding to a greater value of first and second amorphization start current values of the variable resistance memory cell, the first amorphization start current value being determined by a first pulse having the first polarity, the second amorphization start current value being determined by a second pulse having the second polarity.

A method of operating a memory device according to an embodiment of the present disclosure may include applying a write pulse to a variable resistance memory cell coupled a first conductive line and a second conductive line that intersect with each other. The write pulse may have one of a first polarity and a second polarity that are opposite to each other, and may be applied to the first conductive line. The method may further include applying a read pulse having a polarity corresponding to a greater value of first and second amorphization start current values of the variable resistance memory cell to the first conductive line to read the data written to the variable resistance memory cell. The first amorphization start current value may be obtained by applying a first pulse having the first polarity to a variable resistance memory cell, and the second amorphization start current value may be obtained applying a second pulse having the second polarity to the variable resistance memory cell, the second polarity being opposite to the first polarity.

The read pulse may be used to read a set state of the variable resistance memory cell.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments of the present disclosure provide an electronic device, a memory device, and a method of operating the memory device, which are capable of improving operational reliability.

Figure 1A:
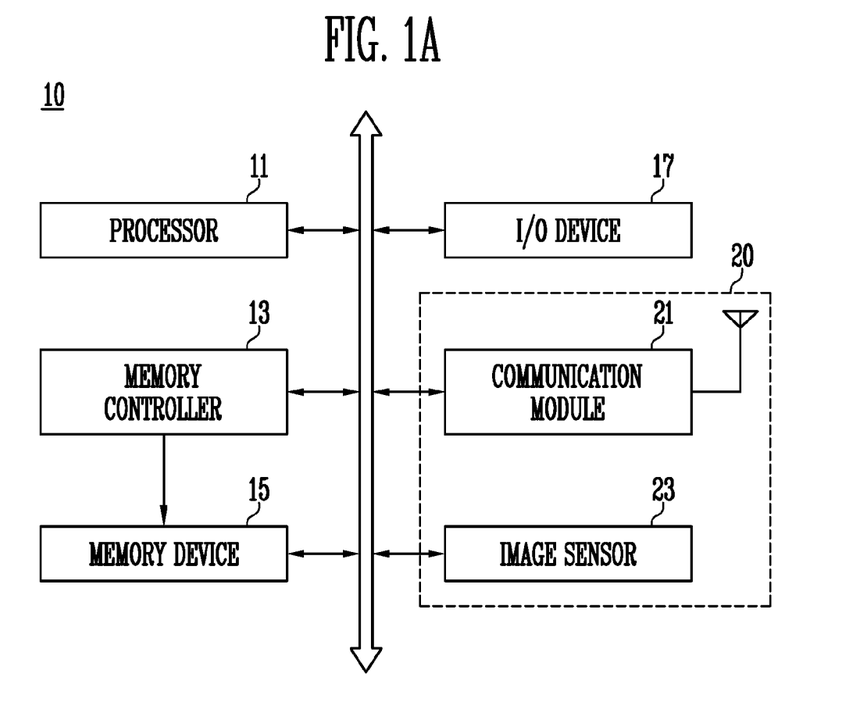
FIGS. 1A and 1B illustrate electronic devices according to embodiments of the present disclosure.
Figure 1B:
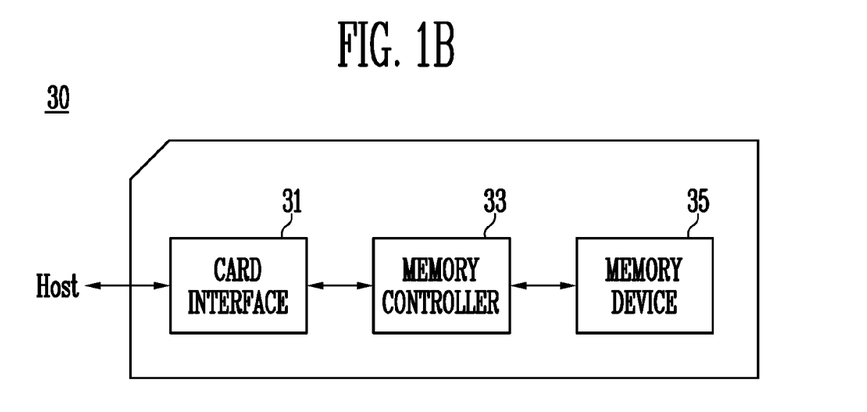

FIGS. 1A and 1B illustrate electronic devices according to embodiments of the present disclosure.

Referring to FIG. 1A, an electronic device 10 may include a processor 11, a memory controller 13, a memory device 15, an input/output (I/O) device 17, and a function module 20.

The memory controller 13 may control a data processing operation (for example, a write operation, a read operation, or the like) of the memory device 15 under the control of the processor 11. In an embodiment, the memory controller 13 may be implemented as a part of the processor 11. In another embodiment, the memory controller 13 and the processor 11 are implemented separately.

The memory device 15 may be a non-volatile memory device. For example, the memory device 15 may include a non-volatile memory device having a variable resistance element.

Data stored in the memory device 15 may be output through the input/output device 17 under the control of the processor 11 and the memory controller 13. To this end, the input/output device 17 may include a display device, a speaker, and the like.

The input/output device 17 may include an input device capable of receiving a control signal for controlling an operation of the processor 11 or data to be processed by the processor 11. For example, the input device may include one or more of a touch pad, a computer mouse, a pointing device, a keypad, a keyboard, and the like.

The function module 20 is configured to perform a function selected according to a type of the electronic device 10.

In an embodiment, the electronic device 10 may be a cellular phone, a smart phone, a personal digital assistant (PDA), or a wireless Internet device. In this case, the function module 20 may include a communication module 21 so that the electronic device 10 provides a communication environment in which data and a control signal may be exchanged by accessing a wired or wireless communication network.

In another embodiment, the electronic device 10 may be a digital camera or a digital camcorder. In still another embodiment, the electronic device 10 may be a personal computer (PC), a notebook computer, a mobile communication terminal, or the like, to which a digital camera or a digital camcorder is attached. In these embodiments, the function module 20 may include an image sensor 23. The image sensor 23 converts an optical image into digital image signals and transfers the digital image signals to the processor 11 and the memory controller 13. In another embodiment, the electronic device 10 may include both of the communication module 21 and the image sensor 23.

Referring to FIG. 1B, an electronic device 30 may be configured of a memory card such as a PC card (e.g., personal computer memory card international association (PCMC IA)), a compact flash card (CF), a smart media card (SMC), a memory stick, a multimedia card (MMC), a reduced size-multimedia card (RS-MMC), an MMC micro card, a secure digital (SD) card, a mini secure digital (mSD) card, a micro secure digital (micro SD) card, a secure digital high capacity (SDHC) card, a universal flash storage device (UFS), or the like.

The electronic device 30 may include a card interface 31, a memory controller 33, and a memory device 35.

The card interface 31 interfaces a data exchange between a host Host and the memory controller 33 according to a protocol of the host Host. In an embodiment, the card interface 31 may be implemented with hardware that may support the protocol of the host Host and/or software that may support the protocol of the host Host. The card interface 31 may perform a signal transmission method.

The memory controller 33 controls a data exchange between the memory device 35 and the card interface 31.

The memory device 35 may be a non-volatile memory device. For example, the memory device 35 may include a non-volatile memory device having a variable resistance element.

An electronic device according to an embodiment of the present disclosure is not limited to those described above with reference to FIGS. 1A and 1B. The memory devices 15 and 35 respectively shown in FIGS. 1A and 1B may include structures and characteristics described below with reference to FIGS. 2, 4, and 5.

Hereinafter, a memory device according to an embodiment of the present disclosure will be described in more detail.

Figure 2:
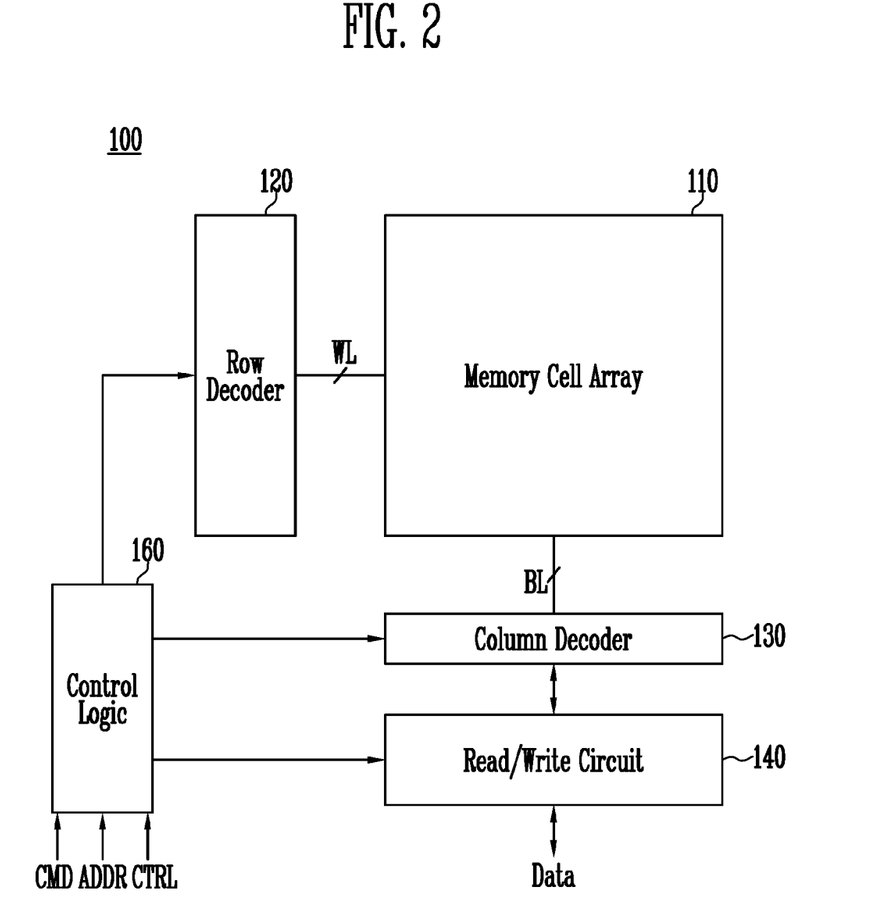
FIG. 2 illustrates a memory device according to an embodiment of the present disclosure.

FIG. 2 illustrates a memory device 100 according to an embodiment of the present disclosure. The memory device 100 may correspond to each of the memory devices 15 and 35 included in the electronic devices 10 and 30 shown in FIGS. 1A and 1B, respectively.

Referring to FIG. 2, the memory device 100 may include a memory cell array 110 and a peripheral circuit that controls an operation of the memory cell array 110. The peripheral circuit may include a row decoder 120, a column decoder 130, a read/write circuit 140, and a control logic 160.

The memory cell array 110 may include a plurality of memory cells arranged in a two-dimensional or three-dimensional structure. Each of the memory cells may be configured as a variable resistance memory cell using a phase change. The memory cells are disposed at intersections of word lines WL and bit lines BL and connected to the word lines WL and the bit lines BL.

The row decoder 120 may be connected to the memory cell array 110 through the word lines WL. The row decoder 120 may apply a voltage to the word lines WL in response to a row address generated based on an address ADDR input to the control logic 160.

The column decoder 130 may be connected to the memory cell array 110 through the bit lines BL. The column decoder 130 may apply a voltage to the bit lines BL in response to a column address generated based on the address ADDR input to the control logic 160.

The read/write circuit 140 may perform a write operation and a read operation on a memory cell selected from the memory cell array 110. The read/write circuit 140 may be coupled to the bit lines BL through the column decoder 130. The read/write circuit 140 may include a read circuit configured to read data Data stored in the selected memory cell through a bit line selected among the bit lines BL. The read/write circuit 140 may further include a write circuit configured to perform a write operation by providing a write pulse to the selected memory cell through the selected bit line.

The write operation may include a set operation and a reset operation. The set operation is defined as an operation of programming the selected memory cell in a direction in which a resistance of the selected memory cell is reduced, and the reset operation is defined as an operation of programming the selected memory cell in a direction in which the resistance of the selected memory cell increases.

The control logic 160 may output various signals for writing data Data to the memory cell array 110 or reading data Data from the memory cell array 110, on the basis of a command CMD, the address ADDR, and a control signal CTRL received from the outside, for example, from a memory controller. The signals output from the control logic 160 may be provided to the read/write circuit 140, the row decoder 120, and the column decoder 130, and may generally control a plurality of operations including the write operation and the read operation. For example, the control logic 160 may generate operation control signals based on the command CMD and the control signal CTRL, and may provide the generated operation control signals to the read/write circuit 140. The control logic 160 may set a polarity of a read pulse based on amorphization start current values that change according to a polarity of a pulse applied to the bit line. For example, the control logic 160 may set the polarity of the read pulse supplied to a selected bit line when the amorphization start current value is increased during the read operation. Setting the polarity of the read pulse applied to the selected bit line during the read operation will be described later with reference to an embodiment shown in FIGS. 6A to 6C and an embodiment shown in FIGS. 7A to 7C.

Figure 3A:
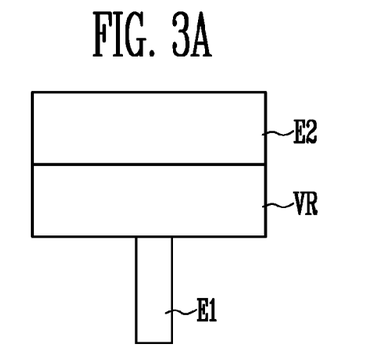
FIGS. 3A to 3C are cross-sectional views schematically illustrating a phase change of a variable resistance memory cell.
Figure 3B:
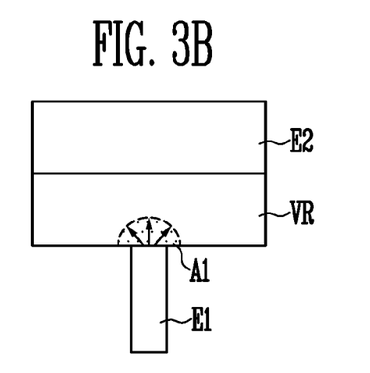
Figure 3C:
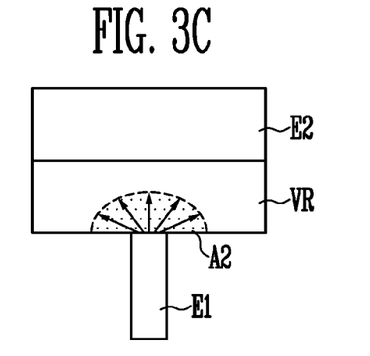

FIGS. 3A to 3C are cross-sectional views schematically illustrating a phase change of a variable resistance memory cell.

Referring to FIGS. 3A to 3C, the variable resistance memory cell may include a variable resistance layer VR disposed between a first electrode E1 and a second electrode E2. The first electrode E1 may be a resistance electrode. The variable resistance layer VR may include a phase change material in which a phase transition may occur between an amorphous state and a crystalline state. The variable resistance layer VR may store data according to a set operation or a reset operation. In the set operation, a resistance state of the variable resistance layer VR changes from a high resistance amorphous state to a low resistance crystalline state. In the reset operation, the resistance state of the variable resistance layer VR changes from a low resistance crystalline state to a high resistance amorphous state. The phase change material may include a chalcogenide-based material.

The variable resistance layer VR may have a low resistance crystalline state as shown in FIG. 3A, or may have a high resistance amorphous state A1 or A2 as shown in FIG. 3B or 3C, respectively.

Figure 4:
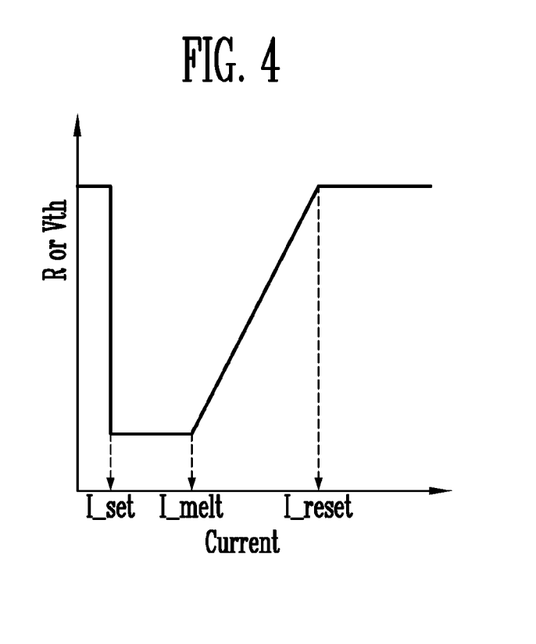
FIG. 4 is a graph illustrating a resistance change and a threshold voltage change according to a current applied to a variable resistance memory cell.

FIG. 4 is a graph illustrating a resistance change and a threshold voltage change according to a current applied to a variable resistance memory cell. FIG. 4 will be described with reference to FIGS. 3A to 3C.

A set current I_set shown in FIG. 4 may be applied to the variable resistance layer VR in the variable resistance memory cell, so that the variable resistance layer VR stores data having a set state that corresponds to a low resistance crystalline state as shown in FIG. 3A. Each of a resistance R and a threshold voltage Vth of the variable resistance layer VR transited to the set state by the set current I_set has a value corresponding to the set state.

When a current equal to or greater than an amorphization start current I_melt shown in FIG. 4 is applied to the variable resistance layer VR in the set state shown in FIG. 3A, heat equal to or greater than a critical point may be generated by the applied current and applied to the variable resistance layer VR from a contact surface of the first electrode E1 and the variable resistance layer VR. Therefore, as shown in FIG. 3B, a portion of the variable resistance layer VR melts, and thus an amorphization region A1 is formed in the variable resistance layer VR. The amorphization start current I_melt corresponds to a melting point of the phase change material included in the variable resistance layer VR, and has a greater value than the set current I_set.

When the current applied to the variable resistance layer VR is increased from the amorphization start current I_melt to a reset current I_reset shown in FIG. 4, as shown in FIG. 3C, an amorphization region formed in the variable resistance layer VR may be expanded to an amorphization region A2 that is wider than the amorphization region A1 shown in FIG. 3B. Therefore, the variable resistance layer VR is transited to the reset state by the reset current I_reset. At this point, each of the resistance R and the threshold voltage Vth of the variable resistance layer VR has a value corresponding to the reset state.

The variable resistance memory cell according to an embodiment of the present disclosure may include the variable resistance layer VR having the above-described characteristics.

Figure 5:
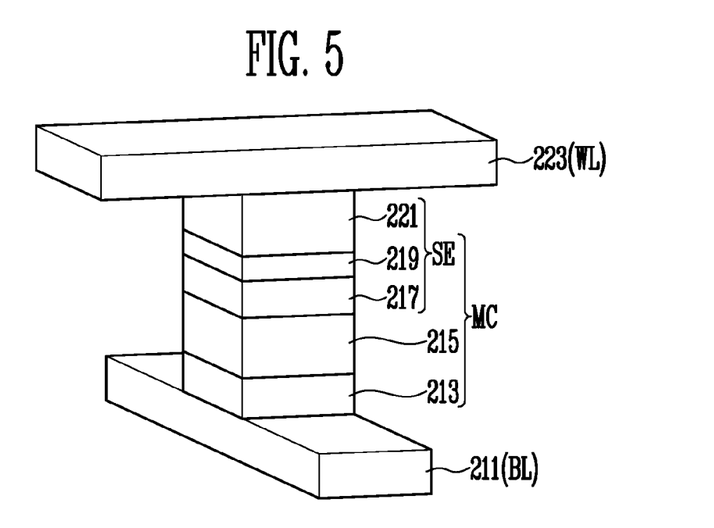
FIG. 5 illustrates a variable resistance memory cell according to an embodiment of the present disclosure.

FIG. 5 illustrates a variable resistance memory cell MC according to an embodiment of the present disclosure.

Referring to FIG. 5, the variable resistance memory cell MC may be disposed at an intersection of a first conductive line 211 and a second conductive line 223 extending in directions intersecting with each other. The variable resistance memory cell MC is coupled to the first conductive line 211 and the second conductive line 223. In an embodiment, the first conductive line 211 may configure a bit line BL shown in FIG. 2 and the second conductive line 223 may configure a word line WL shown in FIG. 2.

In order to drive the variable resistance memory cell MC, a voltage may be applied to the first conductive line 211 and the second conductive line 223, and thus a current may flow through the variable resistance memory cell MC. For example, data may be written to the variable resistance memory cell MC by an electric field formed between the first conductive line 211 and the second conductive line 223 coupled to the variable resistance memory cell MC. In addition, data corresponding to a resistance of the variable resistance memory cell MC may be read by measuring a current flowing through the first conductive line 211.

In an embodiment, each of the first conductive line 211 and the second conductive line 223 may be formed of a metal, a conductive metal nitride, a conductive metal oxide, an alloy thereof, or a combination thereof. For example, each of the first conductive line 211 and the second conductive line 223 may include W, Ti, Ta, Al, Cu, C, CN, TiN, TiAlN, TiSiN, TiCN, TiCSiN, WN, CoSiN, WSiN, TaN, TaCN, TaSiN, Au, Ag, Ir, Pt, Pd, Ru, Zr, Rh, Ni, Co, Cr, Sn, Zn, ITO, an alloy thereof, or a combination thereof.

In another embodiment, each of the first conductive line 211 and the second conductive line 223 may include a metal layer and a conductive barrier layer. The conductive barrier layer may be formed of Ti, TiN, Ta, TaN, or a combination thereof.

The variable resistance memory cell MC may include a variable resistance layer 215 disposed between the first conductive line 211 and the second conductive line 223, a resistance electrode 213 disposed between the variable resistance layer 215 and the first conductive line 211, and a selection element SE disposed between the variable resistance layer 215 and the second conductive line 223.

As shown in FIG. 5, the first conductive line 211, the resistance electrode 213, the variable resistance layer 215, the selection element SE, and the second conductive line 223 are sequentially stacked in a vertical direction with respect to the orientation of FIG. 5.

An arrangement of the first conductive line 211, the resistance electrode 213, the variable resistance layer 215, the selection element SE, and the second conductive line 223 is not limited to that shown in FIG. 5, and may be variously changed.

The selection element SE may be a current adjustment element capable of controlling a flow of a current. The selection element SE may include a selection element layer 219, an intermediate electrode 217 disposed between the selection element layer 219 and the variable resistance layer 215, and an upper electrode 221 disposed between the second conductive line 223 and the selection element layer 219.

In an embodiment, the selection element layer 219 may include a chalcogenide-based ovonic threshold switch (OTS) material. For example, the selection element layer 219 may include arsenic (As) and may include a compound including two or more of silicon (Si), germanium (Ge), antimony (Sb), tellurium (Te), selenium (Se), indium, Tin (Sn), and the like.

In another embodiment, the selection element layer 219 may include a diode having a rectification characteristic. For example, the selection element layer 219 may include a silicon diode in which a polysilicon layer doped with a P-type impurity is in contact with a polysilicon layer doped with an N-type impurity, or may include an oxide diode in which a p-NiOx layer and an n-TiOx layer are in contact with each other or a p-CuOx layer and an n-TiOx layer are in contact with each other.

In still another embodiment, the selection element layer 219 may include an oxide. Thus, the selection element layer 219 has a high resistance to prevent a current from flowing therein when a voltage less than a specific voltage is applied thereto, and has a low resistance to allow a current to flow therein when a voltage greater than the specific voltage is applied thereto. For example, the selection element layer 219 may include ZnOx, MgOx, AlOx, or the like.

Each of the upper electrode 221 and the intermediate electrode 217 may be formed of a metal, a conductive metal nitride, a conductive metal oxide, a conductive material including carbon, or a combination thereof. For example, each of the upper electrode 221 and the intermediate electrode 217 may be formed of W, WN, WC, SiN, SiCN, TiN, TiON, Al, AlN, Ta, TaN, an alloy thereof, or a combination thereof.

A phase of the variable resistance layer 215 may be reversibly changed by joule heat generated by a voltage applied to the first conductive line 211 and the second conductive line 223, and may include a phase change material of which a resistance may be changed by the phase change. For example, the variable resistance layer 215 may include a chalcogenide-based material. The chalcogenide-based material may be a GST-based material in which germanium (Ge), antimony (Sb), and tellurium (Te) are combined at a predetermined ratio.

The resistance electrode 213 may include a conductive material capable of generating heat sufficient to cause the phase change in the variable resistance layer 215. The resistance electrode 213 may be formed of a metal, a conductive metal nitride, a conductive metal oxide, a conductive material including carbon, or a combination thereof. For example, the resistance electrode 213 may be formed of W, WN, WC, SiN, SiCN, TiN, TiON, Al, AlN, Ta, TaN, an alloy thereof, and a combination thereof.

The amorphization start current of the variable resistance layer 215 may be changed according to a polarity of a voltage pulse applied to the first conductive line 211 or the second conductive line 223. This is caused by a thermoelectric effect occurring at an interface between the variable resistance layer 215 and the resistance electrode 213 that is in contact with the variable resistance layer 215, or at an interface between the variable resistance layer 215 and the intermediate electrode 217 that is in contact with the variable resistance layer 215. Such a phenomenon is disclosed in a thesis entitled "Evidence of the Thermo-Electric Thomson Effect and Influence on the Program Conditions and Cell Optimization in Phase-Change Memory Cells" written by D. Tio Castro et al. (2007 IEEE International Electron Devices Meeting, pp. 315-318).

The amorphization start current of the variable resistance layer 215 may be increased or reduced according to a polarity of an electric field applied to the variable resistance layer 215 by controlling at least one of an interface characteristic between the variable resistance layer 215 and the resistance electrode 213 and an interface characteristic between the variable resistance layer 215 and the intermediate electrode 217.

The above-described interface characteristics may be variously changed by forming the intermediate electrode 217 and the resistance electrode 213 with different conductive materials. Alternatively, the interface characteristics may be variously changed by injecting an impurity into at least one of the intermediate electrode 217 and the resistance electrode 213 when the intermediate electrode 217 and the resistance electrode 213 include the same conductive material. As another example, the interface characteristics may be variously changed by heat-treating at least one of the intermediate electrode 217 and the resistance electrode 213 when the intermediate electrode 217 and the resistance electrode 213 include the same conductive material. As still another example, the interface characteristics may be variously changed by inducing a physical property change on a surface of at least one of the intermediate electrode 217 and the resistance electrode 213 when the intermediate electrode 217 and the resistance electrode 213 include the same conductive material.

That is, the interface characteristic between the variable resistance layer 215 and the resistance electrode 213 and the interface characteristic between the variable resistance layer 215 and the intermediate electrode 217 may be variously changed using the above-described various methods.

Read disturbance may occur due to various causes while reading data stored in the variable resistance memory cell MC. Particularly, during reading the set state of the variable resistance memory cell MC, an excessively high current may be applied to the variable resistance layer 215 at the time of turning on the selection element SE, and thus a portion of the variable resistance layer 215 having the set state may be changed to an amorphous state. Therefore, the data stored in the variable resistance memory cell MC may be changed from the set state to the reset state. Such a phenomenon is disclosed in a thesis titled "Effects of threshold switching and parasitic capacitance in the programming transient of chalcogenide phase-change memories" written by D. Ielmini et al. (ICMTD-2005, pp. 195-198).

In embodiments of the present disclosure, the data stored in the variable resistance memory cell MC is read under the condition of increasing an amorphization start current value of the variable resistance layer 215. Therefore, it is possible to suppress such a phase transition phenomenon that may occur in the variable resistance layer 215 when an excessive current is applied to the variable resistance layer 215 during a read operation.

In particular, while reading the set state of the variable resistance memory cell MC, the read operation is performed on the variable resistance memory cell MC under the condition of increasing the amorphization start current value of the variable resistance layer 215. As a result, the phenomenon that the set or crystalline state of the variable resistance element 215 is changed to the reset or amorphous state may be suppressed, and thus the read disturbance can be improved.

Figure 6A:
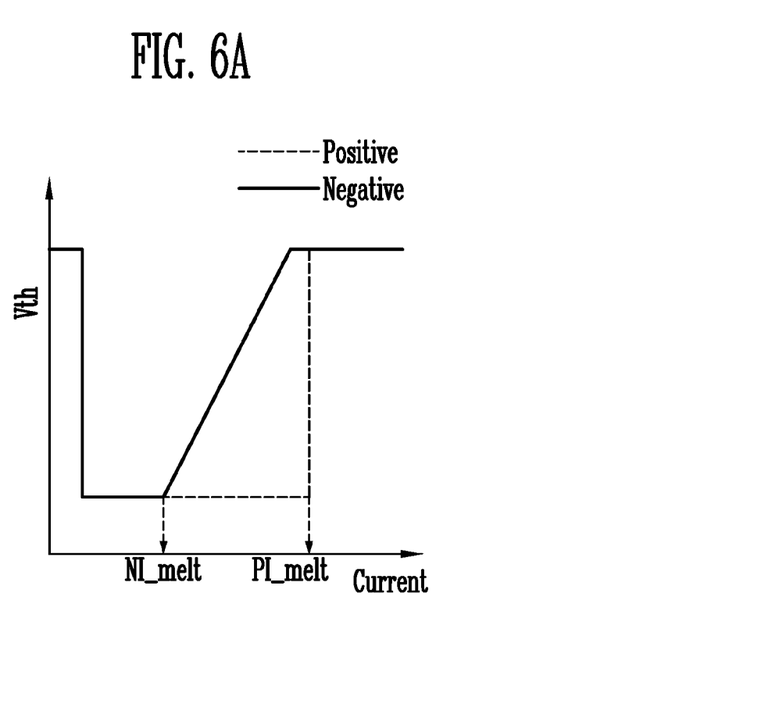
FIGS. 6A to 6C illustrate a method of operating a memory device according to an embodiment of the present disclosure.
Figure 6B:
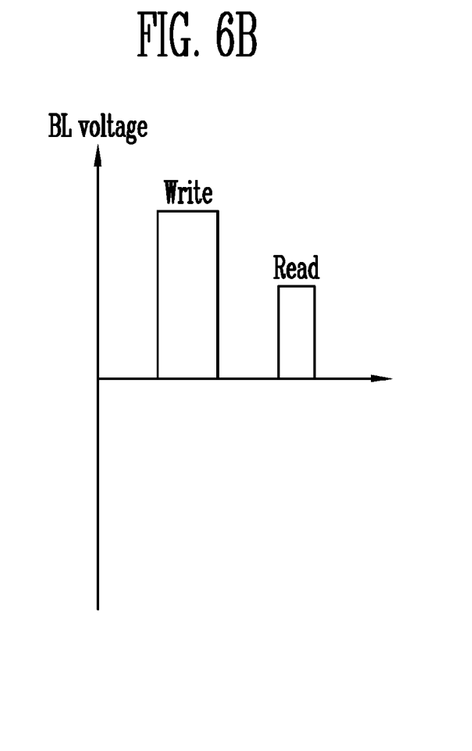
Figure 6C:
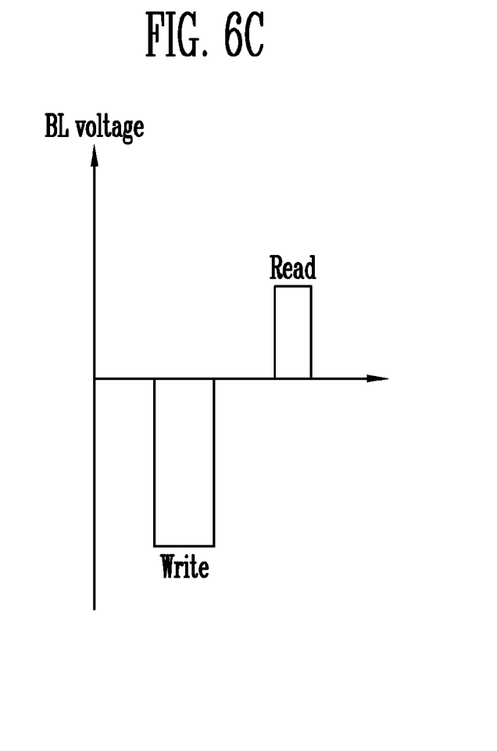
Figure 7A:
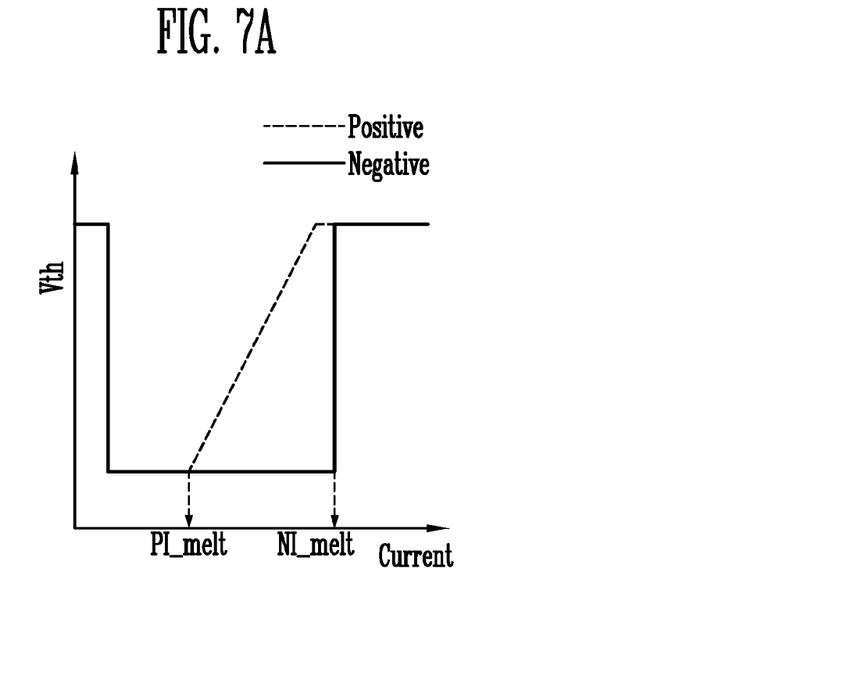
FIGS. 7A to 7C illustrate a method of operating a memory device according to an embodiment of the present disclosure.
Figure 7B:
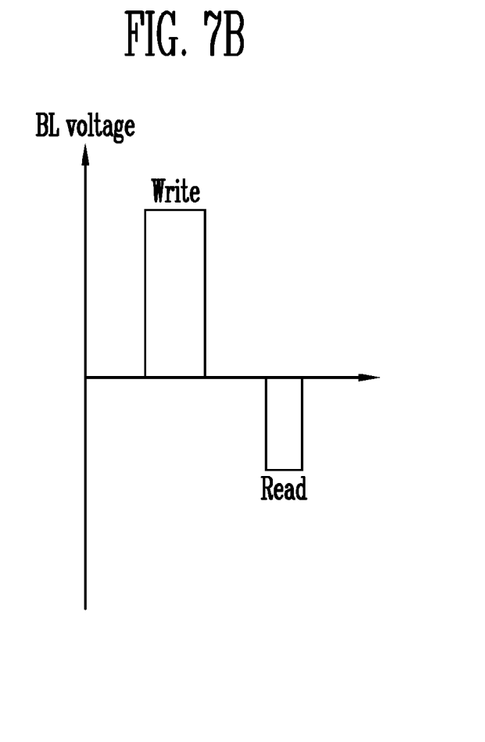
Figure 7C:
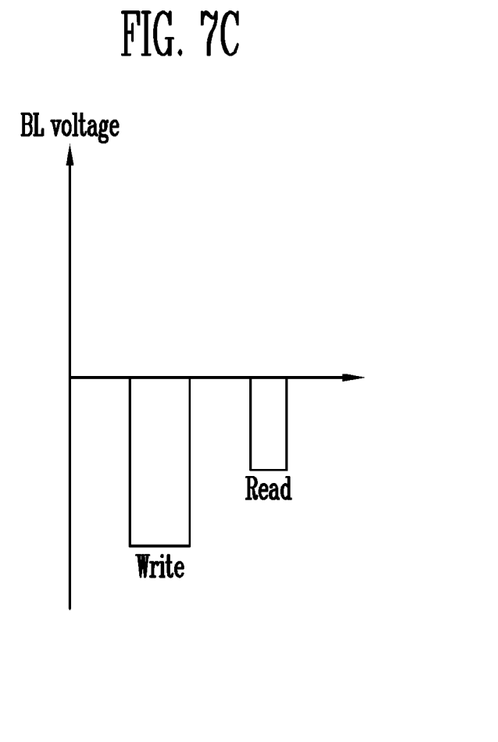

FIGS. 6A to 6C illustrate a method of operating a memory device according to an embodiment of the present disclosure. FIGS. 7A to 7C illustrate a method of operating a memory device according to an embodiment of the present disclosure.

FIGS. 6A and 7A are graphs each illustrating amorphization start current values PI_melt and NI_melt of a variable resistance layer, which are changed according to a polarity of a pulse applied to the first conductive line 211 shown in FIG. 5.

Referring to FIGS. 6A and 7A, the amorphization start current values NI_melt and PI_melt may be obtained by respectively applying a first write pulse having a first polarity and a second write pulse having a second polarity to the first conductive line 211 shown in FIG. 5. The second polarity is opposite to the first polarity. In FIGS. 6A and 7A, the first write pulse having the first polarity may be a positive pulse that is indicated by a dotted line, and the second write pulse having the second polarity may be a negative pulse that is indicated by a solid line. Referring to FIG. 5, when the first write pulse is applied to the first conductive line 211, a current flows from the first conductive line 211 to the second conductive line 223. When the second write pulse is applied to the first conductive line 211, a current flows from the second conductive line 223 to the first conductive line 211.

As described above, the amorphization start current values NI_melt and PI_melt may be variously changed according to the interface characteristic between the variable resistance layer 215 and the resistance electrode 213 and the interface characteristic between the variable resistance layer 215 and the intermediate electrode 217.

In FIG. 6A, the first amorphization start current value PI_melt corresponding to the first write pulse having the first polarity may be greater than the second amorphization start current value NI_melt corresponding to the second write pulse having the second polarity. On the other hand, in FIG. 7A, the second amorphization start current value NI_melt corresponding to the second write pulse having the second polarity may be greater than the first amorphization start current value PI_melt corresponding to the first write pulse having the first polarity.

FIGS. 6B and 6C illustrate polarities of pulses applied to the first conductive line 211 configuring a bit line BL when performing a write operation and a read operation on a memory cell having the characteristics shown in FIG. 6A.

Referring to FIGS. 6B and 6C, during the read operation, a polarity of a read pulse applied to the first conductive line 211 may be controlled to have the first polarity that is associated with the first amorphization start current value PI_melt having a greater value than the second amorphization start current value NI_melt as shown in FIG. 6A. Therefore, when performing the read operation, it is possible to suppress the phase transition phenomenon that may occur in the variable resistance layer 215, and thus the read disturbance may be improved. The read operation is performed after the write operation.

A write pulse applied to the first conductive line 211 for performing the write operation may be controlled to have any one of the first polarity and the second polarity. For example, as shown in FIG. 6B, a polarity of the write pulse applied to the first conductive line 211 during the write operation may be the first polarity that is the same as the polarity of the read pulse applied to the first conductive line 211 during the read operation. On the other hand, as shown in FIG. 6C, the polarity of the write pulse applied to the first conductive line 211 during the write operation may be the second polarity that is opposite to the polarity of the read pulse applied to the first conductive line 211 during the read operation. That is, the polarity of the read pulse according to the embodiment of the present disclosure is determined by one of the first amorphization start current value PI_melt and the second amorphization start current value NI_melt that has a greater value, rather than by the polarity of the write pulse.

Referring to FIGS. 6A to 6C, since the first amorphization start current value PI_melt has a greater value than the second amorphization start current value NI_melt, the read pulse used to perform the read operation is set to the first polarity and the read pulse having the first polarity is applied to the first conductive line 211 regardless of the polarity of the write pulse used to perform the write operation as shown in FIGS. 6B and 6C.

FIGS. 7B and 7C illustrate polarities of pulses applied to the first conductive line 211 configuring the bit line BL when performing a write operation and a read operation on a memory cell having the characteristics shown in FIG. 7A.

Referring to FIGS. 7B and 7C, during the read operation, a polarity of a read pulse applied to the first conductive line 211 may be controlled to have the second polarity that is associated with the second amorphization start current value NI_melt having a greater value than the first amorphization start current value PI_melt as shown in FIG. 7A. Therefore, when performing the read operation, it is possible to suppress the phase transition phenomenon that may occur in the variable resistance layer 215, and thus the read disturbance may be improved. The read operation is performed after the write operation.

As shown in FIG. 7B, a write pulse applied to the first conductive line 211 in the write operation may have a polarity opposite to the polarity of the read pulse applied to the first conductive line 211. Alternatively, as shown in FIG. 7C, the write pulse applied to the first conductive line 211 in the write operation may have the same polarity as the polarity of the read pulse applied to the first conductive line 211.

That is, the write pulse applied to the first conductive line 211 in the write operation may be controlled to any one of the first polarity and the second polarity. However, the read pulse is controlled to have the polarity that is determined by one of the first amorphization start current value PI_melt and the second amorphization start current value NI_melt that has a higher value, rather than by the polarity of the write pulse.

Referring to FIGS. 7A to 7C, since the second amorphization start current value NI_melt has a higher value than the first amorphization start current value PI_melt, the read pulse used to perform the read operation is set to the second polarity and the read pulse having the second polarity is applied to the first conductive line 211 regardless of the polarity of the write pulse used to perform the write operation as shown in FIGS. 7B and 7C.

Figure 8A:
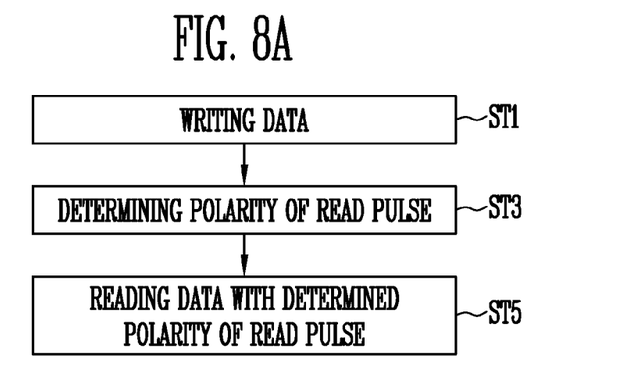
FIGS. 8A to 8C are flowcharts illustrating methods of operating a memory device according to embodiments of the present disclosure.
Figure 8B:
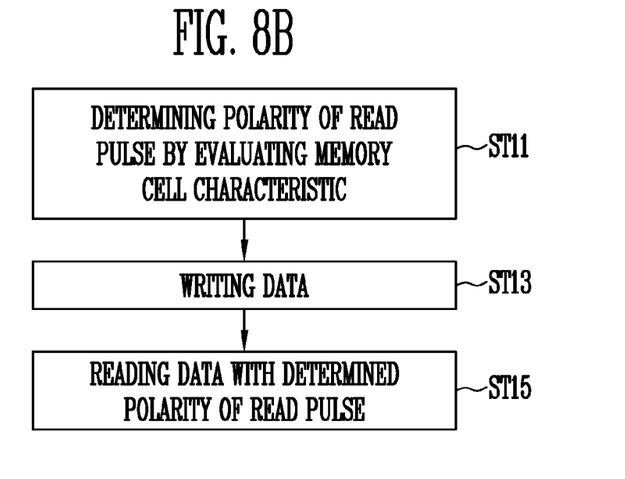
Figure 8C:
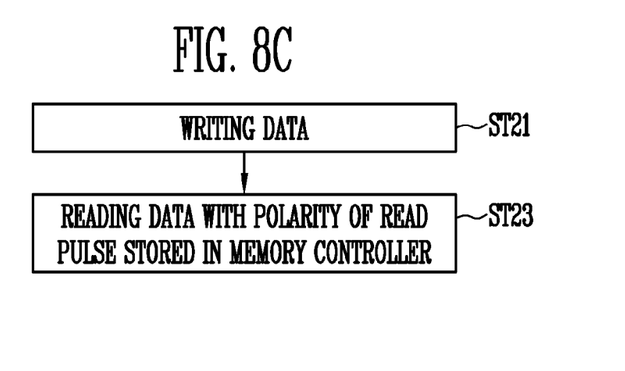

FIGS. 8A to 8C are flowcharts illustrating methods of operating a memory device according to embodiments of the present disclosure.

A polarity of a read pulse may be determined based on a comparison result of amorphization start current values determined according to a polarity of each of a positive pulse and a negative pulse applied to the first conductive line 211, as described above with reference to FIGS. 6A and 7A. The polarity of the read pulse may be determined to one of the first polarity and the second polarity according to a memory cell characteristic so as to increase an amorphization start current value.

The memory cell characteristic is determined when a memory cell is manufactured. The memory cell characteristic may be evaluated at a memory cell manufacturing stage, or may be evaluated in a memory cell operation. As a result, the polarity of the read pulse may be determined to be one of the first polarity and the second polarity at the memory cell manufacturing stage or in the memory cell operation.

FIGS. 8A and 8B show determining a polarity of a read pulse in a memory cell operation. FIG. 8C shows determining a polarity of a read pulse at a memory cell manufacturing stage and storing the determined polarity of the read pulse in the memory controller 13 shown in FIG. 1A or the memory controller 33 shown in FIG. 1B.

Referring to FIG. 8A, at ST1, a write operation for writing data to a memory cell may be performed. The write operation may be performed by applying a write pulse having a selected polarity of the first polarity and the second polarity to a first conductive line coupled to the memory cell.

Subsequently, at ST3, the read pulse may be determined to have one of the first and second polarities that is associated with the greater one of the first and second amorphization start current values. The memory controller 13 in FIG. 1A or the memory controller 33 in FIG. 1B may have the information on the first and second polarities associated with the first and second amorphization start current values. The read pulse may be determined based on the information provided from the memory controller 13 in FIG. 1A or the memory controller 33 in FIG. 1B.

At ST5, in a read operation, data stored in the memory cell may be read using the read pulse having the determined polarity regardless of the selected polarity of the write pulse that is used in the write operation at ST1.

Referring to FIG. 8B, at ST11, a polarity of a read pulse may be determined by evaluating a memory cell characteristic. The polarity of the read pulse may be determined to be one of the first polarity and the second polarity according to the memory cell characteristic that determines a polarity causing a greater amorphization start current value between the first polarity and the second polarity. The memory cell characteristic associated with the greater amorphization start current value may be evaluated by using the first and second write pulses described above with reference to FIGS. 6A and 7A.

At ST13, a write operation for writing data to a memory cell may be performed by applying a write pulse having a selected polarity of the first polarity and the second polarity to a first conductive line coupled to a memory cell.

Subsequently, the data stored in the memory cell may be read at ST15 with the polarity of the read pulse determined at ST11.

Once the polarity of the read pulse is determined at ST11, the determined polarity may be used when repeatedly performing the read operation on the memory cell without being changed. In addition, the polarity of the read pulse determined at ST11 may be used in a read operation for each of other memory cells.

Referring to FIG. 8C, at ST21, a write operation for writing data to a memory cell may be performed. The write operation may be performed by applying a write pulse having a selected polarity of the first polarity and the second polarity to a first conductive line coupled to the memory cell.

Subsequently, at ST23, the data stored in the memory cell may be read with a read pulse having a certain polarity that is stored in a memory controller such as the memory controller 13 in FIG. 1A or the memory controller 33 in FIG. 1B. In this embodiment, the certain polarity of the read pulse is determined at the memory cell manufacturing stage and stored in the memory controller. After that, when performing the read operation on the memory cell, the read pulse having the certain polarity stored in the memory controller is applied to the first conductive line coupled to the memory cell.

In the embodiment shown in FIG. 8A, the step of determining the polarity of the read pulse is repeatedly performed every time data is read. On the other hand, since, in the embodiments shown in FIGS. 8B and 8C, the step of determining the polarity of the read pulse is not required to be repeatedly performed every time data is read, a speed of the read operation may be improved.

Figure 9:
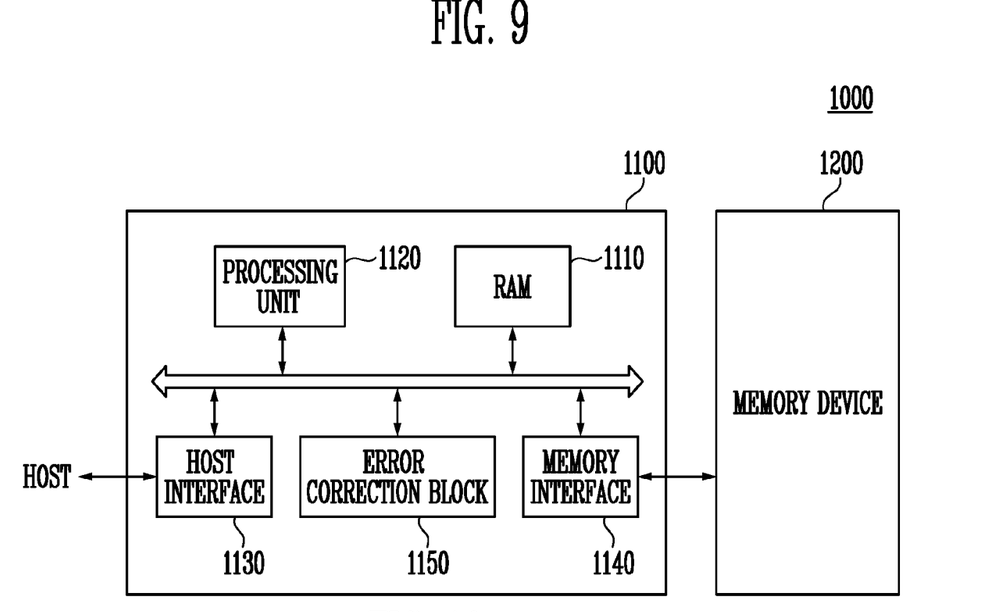
FIGS. 9 and 10 illustrate memory systems according to various embodiments of the present disclosure.
Figure 10:
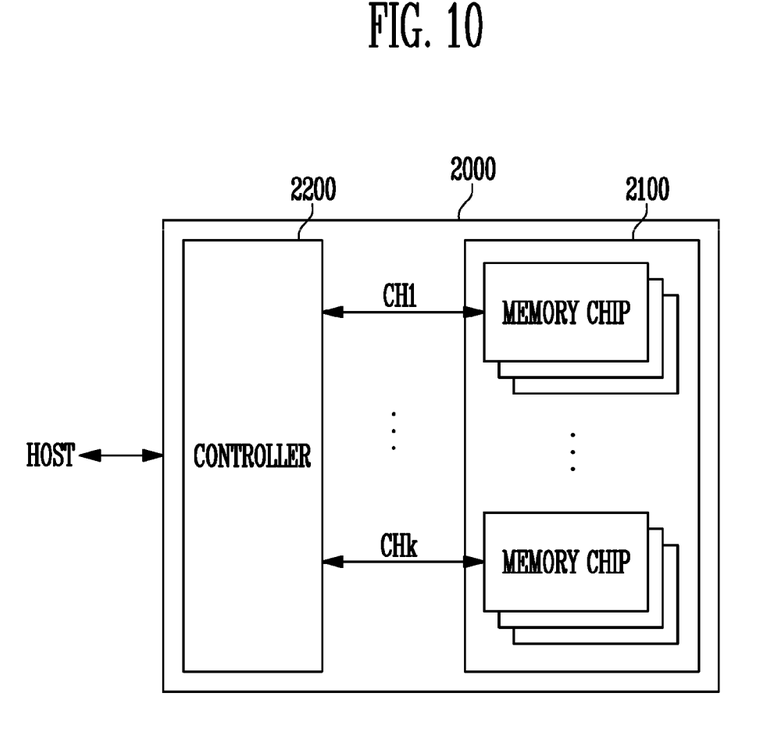

FIGS. 9 and 10 illustrate memory systems according to various embodiments.

Referring to FIG. 9, a memory system 1000 includes a memory device 1200 and a controller 1100.

The controller 1100 is coupled to a host and the memory device 1200. The controller 1100 is configured to access the memory device 1200 in response to a request from the host. For example, the controller 1100 is configured to control a read operation, a write operation, and a background operation of the memory device 1200. The controller 1100 may be configured to control the read operation by storing a polarity of a read pulse determined according to a memory cell characteristic.

The controller 1100 provides an interface between the memory device 1200 and the host. The controller 1100 drives firmware for controlling the memory device 1200.

The controller 1100 includes a random access memory (RAM) 1110, a processing unit 1120, a host interface 1130, a memory interface 1140, and an error correction block 1150.

The RAM 1110 is used as at least one of an operation memory of the processing unit 1120, a cache memory between the memory device 1200 and the host, and a buffer memory between the memory device 1200 and the host. The processing unit 1120 controls all operations of the controller 1100. In addition, the controller 1100 may temporarily store program data provided from the host during a program operation.

The host interface 1130 includes a protocol for performing data exchange between the host and the controller 1100. The protocol may be one of protocols such as peripheral component interconnect (PCI), peripheral component interconnect-express (PCI-E), advanced technology attachment (ATA), serial ATA (SATA), parallel ATA (PATA), small computer small interface (SCSI), serial attached SCSI (SAS), universal serial bus (USB), multi-media card (MMC), enhanced small disk interface (ESDI), integrated drive electronics (IDE), and the like.

The memory interface 1140 provides interfacing between the controller 1100 and the memory device 1200. For example, the memory interface 1140 includes a NAND interface or a NOR interface.

The error correction block 1150 is configured to detect and correct an error of data received from the memory device 1200 using an error correcting code (ECC). The processing unit 1120 controls the memory device 1200 to adjust a read voltage and performs a read operation in accordance with an error detection result of the error correction block 1150.

The controller 1100 and the memory device 1200 may be integrated into one semiconductor device. In an embodiment, the controller 1100 and the memory device 1200 may be integrated into one semiconductor device to form a memory card such as a PC card (e.g., personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), a universal flash memory (UFS), or the like.

The controller 1100 and the memory device 1200 may be integrated into one semiconductor device to form a semiconductor drive (e.g., solid state drive (SSD)). When the memory system 1000 is used as the semiconductor drive (SSD), an operation speed of the host connected to the memory system 1000 is dramatically improved.

For example, the memory system 1000 is provided as one of various components of an electronic device. The electronic device may be one of a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, may be one of various electronic devices capable of transmitting and receiving information in a wireless environment, may be one of various electronic devices configuring a home network, may be one of various electronic devices configuring a computer network, or may be one of various electronic devices configuring a telematics network, an RFID device, or one of various components configuring a computing system.

In an embodiment, the memory device 1200 or the memory system 1000 may be mounted as a package of various types. For example, the memory device 1200 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), a wafer-level fabricated package (WFP), or a wafer-level processed stack package (WSP).

Referring to FIG. 10, a memory system 2000 includes a memory device 2100 and a controller 2200. The memory device 2100 includes a plurality of semiconductor memory chips. The plurality of semiconductor memory chips are divided into a plurality of groups.

The plurality of groups may communicate with the controller 2200 through first to k-th channels CH1 to CHk, respectively, k being a positive integer. Each of the plurality of semiconductor memory chips may correspond to the memory device 1200 described with reference to FIG. 9.

Semiconductor memory chips in each of the plurality of groups communicate with the controller 2200 through one common channel, e.g., a corresponding one of the first to k-th channels CH1 to CHk. The controller 2200 is configured similar to the controller 1100 described with reference to FIG. 9, and controls the plurality of semiconductor memory chips of the memory device 2100.

Figure 11:
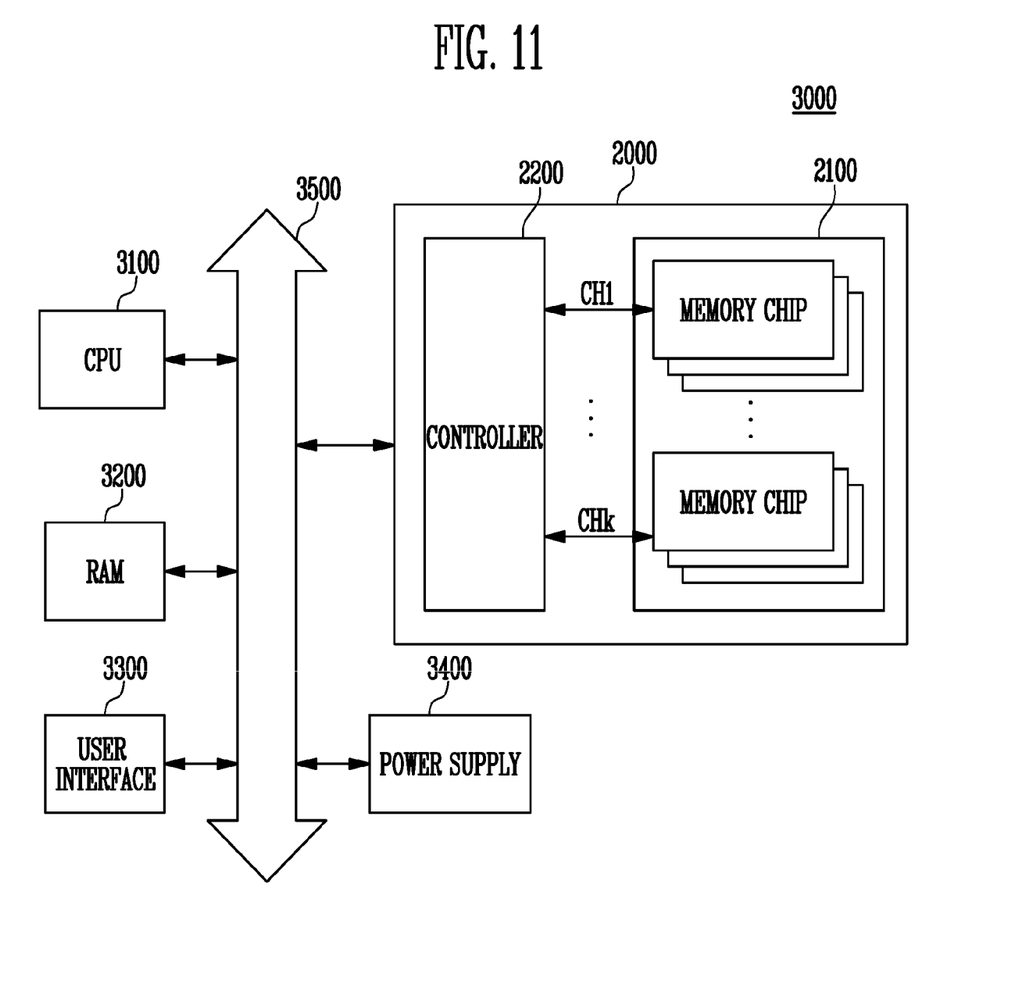
FIG. 11 illustrates a computing system according to an embodiment of the present disclosure.

FIG. 11 illustrates a computing system 3000 according to an embodiment of the present disclosure.

The computing system 3000 includes a central processing unit (CPU) 3100, a random access memory (RAM) 3200, a user interface 3300, a power source 3400, a system bus 3500, and a memory system 2000.

The memory system 2000 is electrically coupled to the CPU 3100, the RAM 3200, the user interface 3300, and the power source 3400 through the system bus 3500. Data provided through the user interface 3300 or processed by the CPU 3100 is stored in the memory system 2000.

The memory system 2000 includes a memory device 2100 and a controller 2200. The memory device 2100 may be coupled to the system bus 3500 through the controller 2200. Alternatively, the memory device 2100 may be directly connected to the system bus 3500. At this time, a function of the controller 2200 is performed under the control of the CPU 3100 and using the RAM 3200.

FIG. 11 illustrates the computing system 3000 that includes the memory system 2000 that corresponds to the memory system 2000 described with reference to FIG. 10. However, embodiments of the present disclosure are not limited thereto.

In another embodiment, the memory system 2000 of the computing system 3000 may be replaced with the memory system 1000 described with reference to FIG. 9. In still another embodiment, the computing system 3000 may include both of the memory systems 1000 and 2000 described with reference to FIGS. 9 and 10, respectively.

Embodiments of the present disclosure may set a polarity of a read pulse used to read data and applied to a conductive line coupled to a memory cell based on amorphization start current values. Therefore, the embodiments of the present disclosure may reduce occurrence of an unintentional phase change in a variable resistance memory cell due to an excessive current flowing in the variable resistance memory cell during a read operation. As a result, the embodiments of the present disclosure may reduce read disturbance and improve operation reliability of a memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An electronic device including a memory device and a memory controller configured to control the memory device, the memory device comprising:
a memory cell array including a variable resistance memory cell coupled to and disposed between a first conductive line and a second conductive line that intersect with each other; and
a peripheral circuit configured to provide a write pulse or a read pulse to the variable resistance memory cell through the first conductive line,
wherein the peripheral circuit controls the write pulse to have one of a first polarity and a second polarity that are opposite to each other, and controls the read pulse to have a polarity corresponding to a greater value of first and second amorphization start current values of the variable resistance memory cell, the first amorphization start current value being determined by a first write pulse having the first polarity, the second amorphization start current value being determined by a second write pulse having the second polarity.

2. The electronic device according to claim 1, wherein the read pulse is used to read a set state of the variable resistance memory cell.

3. The electronic device according to claim 1, wherein the read pulse has the first polarity when the first amorphization start current value is greater than the second amorphization start current value, and the read pulse has the second polarity when the second amorphization start current value is greater than the first amorphization start current value.

4. The electronic device according to claim 3, wherein the peripheral circuit provides the read pulse having the polarity corresponding to the greater value of the first and second amorphization start current values to the variable resistance memory cell in a read operation regardless of a polarity of the write pulse used to perform a write operation on the variable resistance memory cell.

5. The electronic device according to claim 1, wherein the polarity of the read pulse is stored in the memory controller, and the peripheral circuit controls the read pulse based on the polarity stored in the memory controller.

6. A memory device, comprising:
a memory cell array including a variable resistance memory cell coupled to and disposed between a first conductive line and a second conductive line that intersect with each other; and
a peripheral circuit configured to provide a write pulse or a read pulse to the variable resistance memory cell through the first conductive line,
wherein the write pulse is controlled to have one of a first polarity and a second polarity that are opposite to each other, and
wherein the read pulse is controlled to have a polarity corresponding to a greater value of first and second amorphization start current values of the variable resistance memory cell, the first amorphization start current value being determined by a first write pulse having the first polarity, the second amorphization start current value being determined by a second write pulse having the second polarity.

7. The memory device according to claim 6, wherein the read pulse is used to read a set state of the variable resistance memory cell.

8. The memory device according to claim 6, wherein the read pulse has the first polarity when the first amorphization start current value is greater than the second amorphization start current value, and the read pulse has the second polarity when the second amorphization start current value is greater than the first amorphization start current value.

9. The memory device according to claim 8, wherein the peripheral circuit provides the read pulse having the polarity corresponding to the greater amorphization start current value to the variable resistance memory cell in a read operation regardless of a polarity of a write pulse used to perform a write operation on the variable resistance memory cell.

10. The memory device according to claim 6, wherein the variable resistance memory cell comprises:
a variable resistance layer;
a resistance electrode disposed between the variable resistance layer and the first conductive line;
a selection element layer disposed between the variable resistance layer and the second conductive line; and
an intermediate electrode disposed between the variable resistance layer and the selection element layer.

11. The memory device according to claim 10, wherein an amorphization start current of the variable resistance memory cell is adjusted by controlling at least one of an interface characteristic between the variable resistance layer and the resistance electrode and an interface characteristic between the variable resistance layer and the intermediate electrode.

12. The memory device according to claim 10, wherein each of the resistance electrode and the intermediate electrode includes W, WN, WC, SiN, SiCN, TiN, TiON, Al, AlN, Ta, TaN, an alloy thereof, and a combination thereof.

13. The memory device according to claim 12, wherein the resistance electrode and the intermediate electrode include different conductive materials.

14. A method of operating a memory device, the method comprising:
applying a write pulse to a variable resistance memory cell coupled a first conductive line and a second conductive line that intersect with each other, wherein the write pulse has one of a first polarity and a second polarity that are opposite to each other, and is applied to the first conductive line; and
applying a read pulse having a polarity corresponding to a greater value of first and second amorphization start current values of the variable resistance memory cell to the first conductive line to read data written to the variable resistance memory cell,
wherein the first amorphization start current value is obtained by applying a first write pulse having the first polarity to the variable resistance memory cell, and
wherein the second amorphization start current value is obtained by applying a second write pulse having the second polarity to the variable resistance memory cell, the second polarity being opposite to the first polarity.

15. The method according to claim 14, wherein the read pulse is used to read a set state of the variable resistance memory cell.

16. The method according to claim 14, wherein the read pulse has the first polarity when the first amorphization start current value is greater than the second amorphization start current value, and the read pulse has the second polarity when the second amorphization start current value is greater than the first amorphization start current value.

17. The method according to claim 16, wherein the read pulse having the polarity corresponding to the greater value of the first and second amorphization start current values is applied to the variable resistance memory cell in a read operation regardless of a polarity of the write pulse used to perform a write operation on the variable resistance memory cell.

18. The method according to claim 14, wherein the polarity of the read pulse is provided from a memory controller external to the memory device.

19. The method according to claim 14, further comprising:
   repeatedly performing a read operation on the variable resistance memory cell using the read pulse having the determined polarity.

20. The method according to claim 14, further comprising determining the polarity of the read pulse after applying the write pulse.

* * * * *